(12) United States Patent
Wu et al.

(10) Patent No.: US 10,347,729 B2
(45) Date of Patent: Jul. 9, 2019

(54) DEVICE FOR IMPROVING PERFORMANCE THROUGH GATE CUT LAST PROCESS

(71) Applicant: GLOBALFOUNDRIES Inc., Grand Cayman (KY)

(72) Inventors: Xusheng Wu, Ballston Lake, NY (US); Haigou Huang, Rexford, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 21 days.

(21) Appl. No.: 15/590,459

(22) Filed: May 9, 2017

(65) Prior Publication Data

US 2017/0365676 A1    Dec. 21, 2017

Related U.S. Application Data

(62) Division of application No. 15/187,080, filed on Jun. 20, 2016, now Pat. No. 9,679,985.

(51) Int. Cl.

| | |
|---|---|
| *H01L 29/78* | (2006.01) |
| *H01L 29/423* | (2006.01) |
| *H01L 29/49* | (2006.01) |
| *H01L 29/66* | (2006.01) |
| *H01L 21/8234* | (2006.01) |
| *H01L 21/84* | (2006.01) |
| *H01L 27/088* | (2006.01) |
| *H01L 29/06* | (2006.01) |
| *H01L 29/40* | (2006.01) |

(52) U.S. Cl.
CPC ............ *H01L 29/42356* (2013.01); *H01L 21/823431* (2013.01); *H01L 21/845* (2013.01); *H01L 27/0886* (2013.01); *H01L 29/0649* (2013.01); *H01L 29/401* (2013.01); *H01L 29/4991* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 7,898,037 B2 | 3/2011 | Chuang et al. | |
| 9,064,932 B1 | 6/2015 | Pham et al. | |
| 2007/0254435 A1 | 11/2007 | Orlowski | |
| 2008/0258228 A1 | 10/2008 | Chuang et al. | |

(Continued)

*Primary Examiner* — Benjamin P Sandvik
(74) *Attorney, Agent, or Firm* — Thompson Hine LLP; Francois Pagette (57) ABSTRACT

Devices and methods of fabricating integrated circuit devices for increasing performance through gate cut last processes are provided. One method includes, for instance: obtaining an intermediate semiconductor device having a substrate including a plurality of fins, an STI layer, an oxide layer, and a gate material over the oxide layer, the fins extending into the gate material; removing the gate material and the oxide layer; depositing a high k material on a top surface of the STI layer, surrounding the fins; depositing a gate stack over the high k material; filling the top of the device with a gate contact metal; etching a portion of the gate contact metal, the metal gate stack, and the high k material; and filling the portion with an inter-layer dielectric. Also disclosed is an intermediate device formed by the method.

4 Claims, 6 Drawing Sheets

(56) References Cited

U.S. PATENT DOCUMENTS

| | | | |
|---|---|---|---|
| 2012/0086075 A1* | 4/2012 | Huang | H01L 21/28088 |
| | | | 257/334 |
| 2014/0312423 A1* | 10/2014 | Cheng | H01L 21/823807 |
| | | | 257/351 |
| 2015/0076609 A1* | 3/2015 | Xie | H01L 29/785 |
| | | | 257/365 |
| 2015/0255277 A1* | 9/2015 | Tong | H01L 29/785 |
| | | | 257/288 |
| 2015/0255458 A1* | 9/2015 | Ando | H01L 29/517 |
| | | | 257/401 |
| 2016/0071928 A1 | 3/2016 | Xie et al. | |
| 2016/0099211 A1* | 4/2016 | Baek | H01L 27/088 |
| | | | 257/774 |
| 2016/0247728 A1 | 8/2016 | You et al. | |

* cited by examiner

DEVICE FOR IMPROVING PERFORMANCE THROUGH GATE CUT LAST PROCESS

CROSS-REFERENCE TO RELATED APPLICATIONS

This application is a divisional application of U.S. patent application Ser. No. 15/187,080, filed Jun. 20, 2016, and entitled "DEVICES AND METHODS OF IMPROVING DEVICE PERFORMANCE THROUGH GATE CUT LAST PROCESS," the entirety of which is hereby incorporated herein by reference.

FIELD OF THE INVENTION

The present invention relates to semiconductor devices and methods of fabricating semiconductor devices, and more particularly, to devices and methods of improving device performance through a gate cut last process.

BACKGROUND OF THE INVENTION

For 14 nanometer (nm) and beyond devices, a combination of replacement metal gate (RMG) and FinFET processes are typically utilized. However, as the pitch continues to scale down beyond 14 nm devices, the edge formed during a gate cut, which is cut earlier in the process to form or separate the gates, becomes closer to the adjacent fin. This cut is typically done during the poly gate patterning. As a result, a barrier layer and metal fill lie between the inter-layer dielectric (ILD). This creates a physical stress near the adjacent fin and requires a metal fill at the gate cut boundary between the fins and an inter-layer dielectric. These factors can cause overall device performance degradation Therefore, it may be desirable to develop methods of fabricating devices with no barrier layer or metal fill near the fins of the device.

BRIEF SUMMARY

The shortcomings of the prior art are overcome and additional advantage are provided through the provisions, in one aspect, a method that includes, for instance: obtaining an intermediate semiconductor device having a substrate including a plurality of fins, an STI layer, an oxide layer, and a gate material over the oxide layer, the fins extending into the poly gate material; removing the gate material and the oxide layer; depositing a high k material on a top surface of the STI layer, surrounding the fins; depositing a gate stack over the high k material; filling the top of the device with a gate contact metal; etching a portion of the gate contact metal, the metal gate stack, and the high k material; and filling the portion with an inter-layer dielectric.

In another aspect, a device is provided which includes, for instance: an intermediate semiconductor interconnect device having a substrate including a plurality of fins, and an STI layer; a high k material on a top surface of the STI layer, surrounding the fins; a gate stack over the high k material; a gate contact metal over the gate stack; and an inter-layer dielectric in a portion of the device, wherein the inter-layer dielectric directly contacts the gate contact metal.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for semiconductor devices with no metal fill and no stress at the gate cut boundary.

Figure 1:
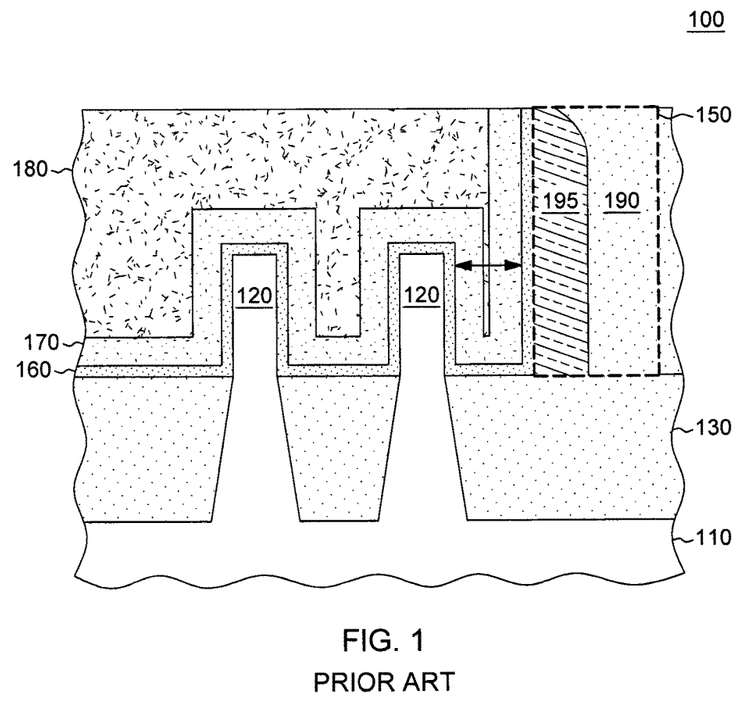
FIG. 1 depicts a cross-sectional elevation view of one embodiment of an intermediate semiconductor structure according to prior methods, having a substrate including a plurality of fins, an STI layer, a high k layer, a gate stack, a gate contact metal, and an inter-layer dielectric area, wherein a spacer is between the high k layer and the gate stack, and wherein the gate stack and high k layer are double between the inter-layer dielectric area and an adjacent fin.

Previous methods typically utilized a gate cut first approach, wherein the gate cut would occur early in the process. That is, an area where an inter-layer dielectric would separate gates was introduced first. Due, in part, to the replacement metal gate (RMG) approach at such small sizes, the gate cut edge becomes closer and closer to the fins, degrading device performance. For instance, turning to FIG. 1, the stress at the gate cut boundary can be seen. Previous methods result in an intermediate semiconductor device 100 having a substrate 110 which includes a plurality of fins 120. Above the substrate is an STI layer 130. Layered and surrounding fins 120 are a high k material 160 and a gate stack 170. However, due to the gate cut first process, the inter-layer areas 150 has been cut early, and thus spacer 195, which is often a nitride spacer, has been deposited in inter-layer area 150. Thus, high k material 160 and gate stack 170 line a vertical side of spacer 195, creating a stress area (shown with arrows) between adjacent fin 120 and the filled inter-layer dielectric 190. This area results in stress at the gate cut boundary, i.e., the area between the adjacent fin 120 and the inter-layer area 150, as well as frequently incomplete metal fill in the small space when the gate contact metal 180 is applied. Mismatch is also generated for the device 100 due to differences near the gate cut boundary and away from the gate cut boundary.

As a result, new methods have been developed which result in a better performing intermediate semiconductor device without the stress and mismatch generated by the previous methods.

Figure 2:
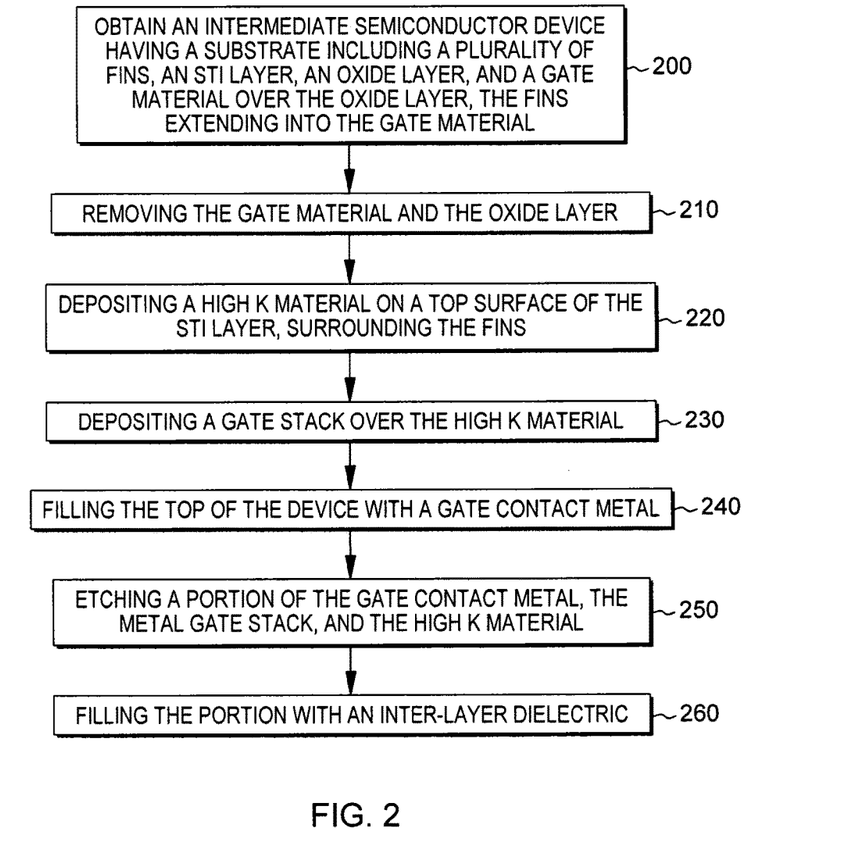
FIG. 2 depicts one embodiment of a method for forming an intermediate semiconductor structure, in accordance with one or more aspects of the present invention.

In one aspect, in one embodiment, as shown in FIG. 2, an integrated circuit device formation process in accordance with one or more aspects of the present invention may include, for instance: obtaining an intermediate semiconductor interconnect device having a substrate including a plurality of fins, an STI layer, an oxide layer, and a gate material over the oxide layer, the fins extending into the metal gate 200; removing the gate material and the oxide layer 210; depositing a high k material on a top surface of the STI layer, surrounding the fins 220; depositing a gate stack over the high k material 230; filling the top of the device with a gate contact metal 240; etching a portion of the gate contact metal, the metal gate stack, and the high k material 250; and filling the portion with an inter-layer dielectric 260.

FIGS. 3-9 depict, by way of example only, one detailed embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 3:
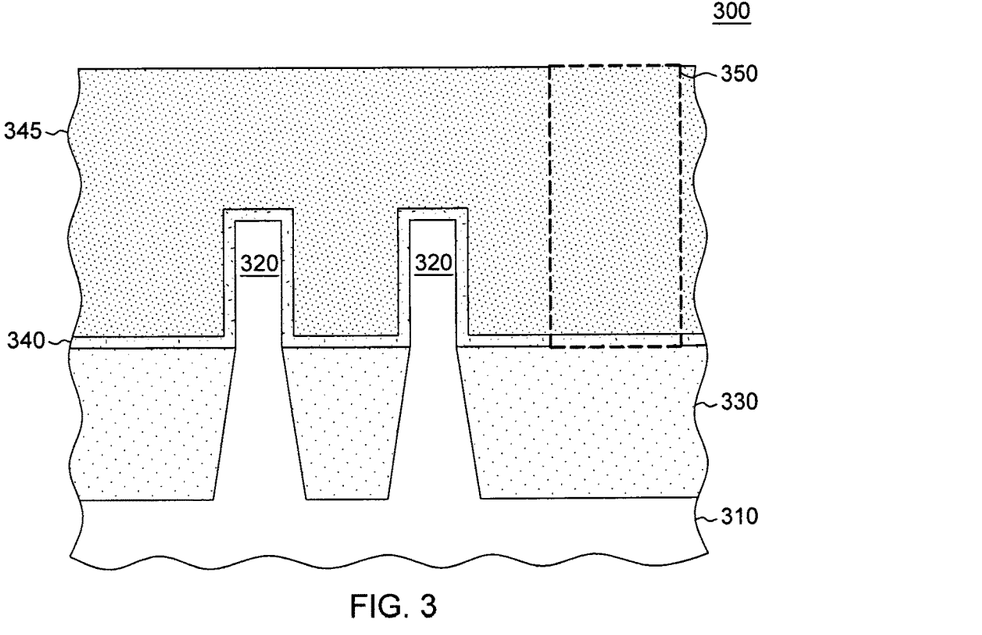
FIG. 3 depicts a cross-sectional elevation view of one embodiment of an intermediate semiconductor structure having a substrate including a plurality of fins, an STI layer, an oxide layer, and a gate material over the oxide layer, the fins extending into the gate material, in accordance with one or more aspects of the present invention.

FIG. 3 shows a portion of an intermediate semiconductor device generally denoted 300, depicted at an intermediate semiconductor fabrication stage. The device 300 may have been processed through initial device processing steps in accordance with the design of the device 300 being fabricated. For example, the device 300 may include, for instance, a substrate 310 with a plurality of fins 320 formed thereon. The substrate 210 may be any suitable material, for example, silicon. Any number of fins 320 may be formed. Additionally, STI layer 330 may be deposited on substrate 310. STI layer may be formed from any material useful in shallow trench isolation, which may include one or more dielectric materials, and may include a mixed matrix of materials or a plurality of layers of materials (not shown). An oxide layer 340, typically a dummy oxide meant for removal, may be formed over STI material 330 and around fins 320, with a gate material 345 over the oxide layer 340, with the fins 320 extending into the gate material 345. In some embodiments, the gate material 345 includes a poly gate material.

Also outlined in FIG. 3 is inter-layer area 350. In prior methods, this area would be etched at this stage of production, resulting in the problems detailed above. However, according to current embodiments, this area will be left as is and processed later. For ease of description, inter-layer area 350 is illustrated throughout the figures.

In another embodiment (not shown), the substrate of device 300 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a front end of line (FEOL) portion of an integrated circuit (IC).

Figure 4:
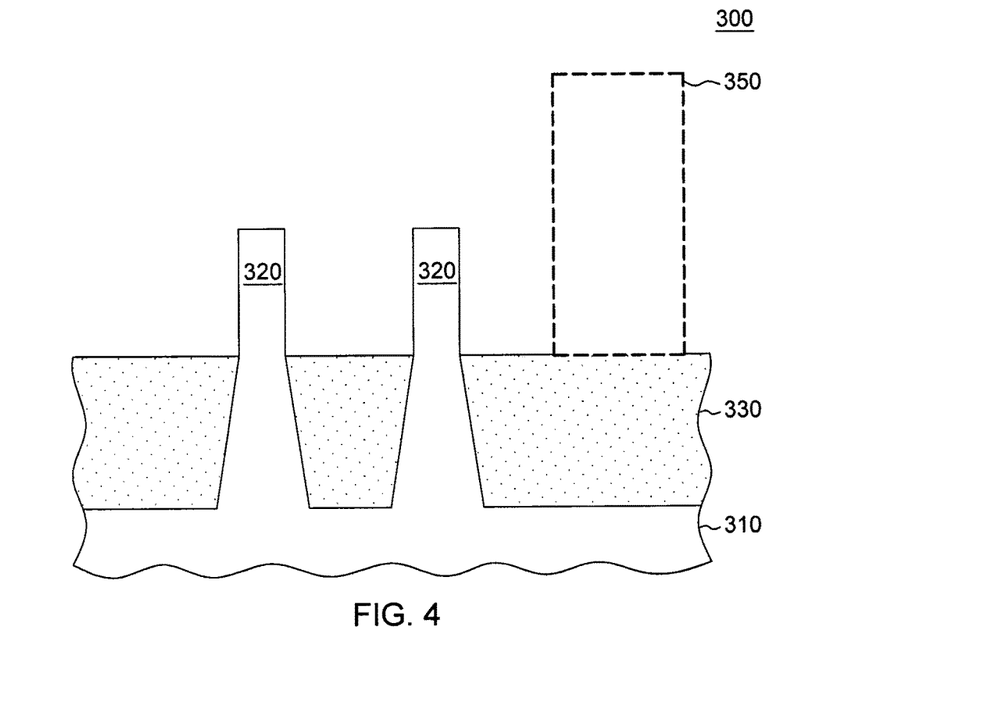
FIG. 4 depicts the structure of FIG. 3 after removing the gate material and the oxide layer, in accordance with one or more aspects of the present invention.

As depicted in FIG. 4, using standard lithography and etching processes, the oxide layer 340 and the gate material 345 are removed. The removal may include etching, which may be performed by any suitable etching process, for example, a directional reactive ion etching (RIE). At this stage in the prior methods, the spacer 295 (FIG. 1) would have already been formed. While no spacer 195 is required in the inter-layer area 350, it should be understood that similar spacers (not shown) may be used in other areas than the inter-layer area 350 outside of the illustrated area of device 300. These spacers can include nitride materials and low k materials that act as a spacer between adjacent parts of device 300.

Figure 5:
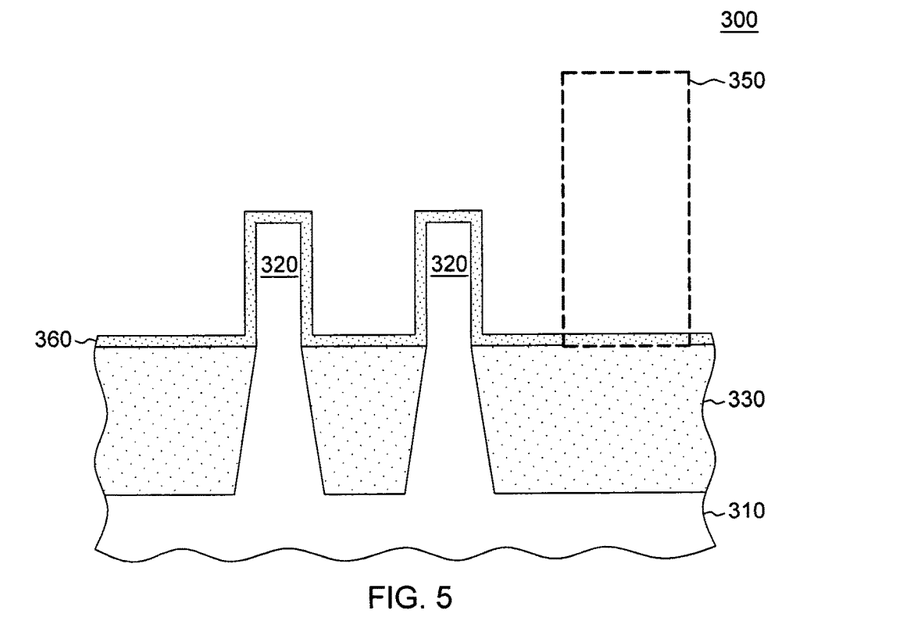
FIG. 5 depicts the structure of FIG. 4 after depositing a high k material on a top surface of the STI layer, surrounding the fins, in accordance with one or more aspects of the present invention.

As depicted in FIG. 5, a high k material 360 may be deposited along a top surface of the STI layer 330, surrounding and covering the side and top surfaces of fins 320 where exposed following the removal of the gate material 345 and the oxide layer 340, by atomic layer deposition (ALD), chemical vapor deposition (CVD), physical vapor deposition (PVD), or any other suitable deposition technique now known or later developed. For instance, the high k material can be any material with a high dielectric constant (k) as compared to that of silicon dioxide. In some embodiments, the high k material 360 may include aluminum oxide, hafnium silicate, zirconium silicate, hafnium dioxide, zirconium dioxide, or any other high k material now known or later developed.

Figure 6:
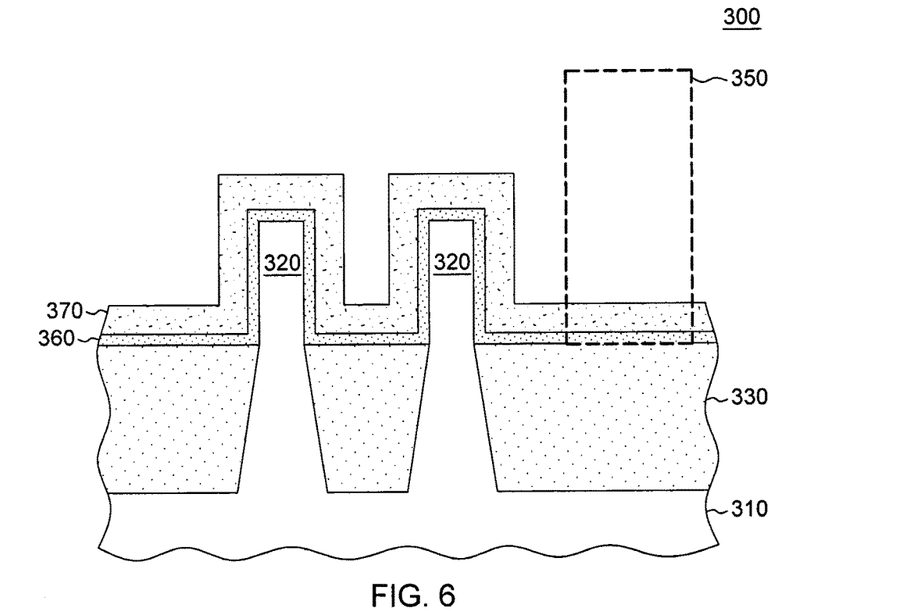
FIG. 6 depicts the structure of FIG. 5 after depositing a gate stack over the high k material, in accordance with one or more aspects of the present invention.

As depicted in FIG. 6, a gate stack 370 may be deposited, again by any of the above listed deposition techniques, over the high k material 360. The gate stack 370 may include a metal gate stack, including but not limited to any material that can be used in a metal gate, such as titanium nitride (TiN).

Figure 7:
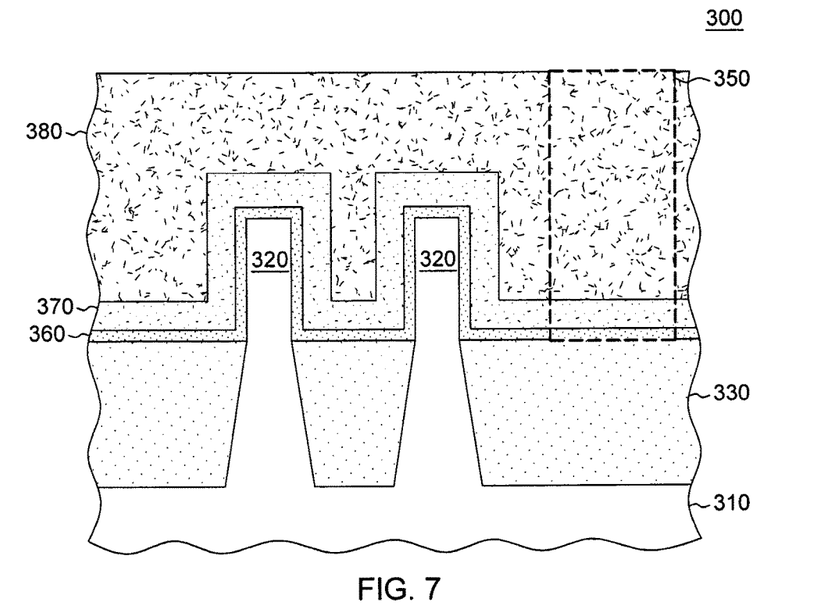
FIG. 7 depicts the structure of FIG. 6 after filling the top of the device with a gate contact metal, in accordance with one or more aspects of the present invention.

As depicted in FIG. 7, following deposition of high k material 360 and gate stack 370, the remaining area of device 300 can be filled, for instance, with a gate contact metal 380, which may include tungsten or another suitable metal. As can be seen, the gate contact metal 380 will fill any remaining space, including the inter-layer area 350. In some embodiments, following filling with gate contact metal 380, the top of the device 300, which will include a gate contact metal top surface currently, may be planarized using chemical mechanical polishing (CMP) or other methods to even out and polish the top surface.

Figure 8:
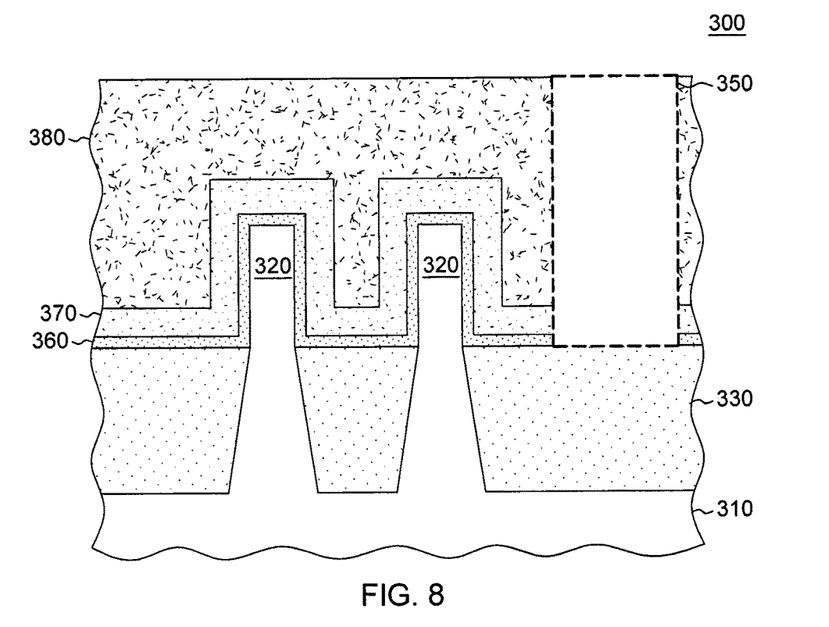
FIG. 8 depicts the structure of FIG. 7 after etching a portion of the gate contact metal, the metal gate stack, and the high k material, in accordance with one or more aspects of the present invention.

As depicted in FIG. 8, a portion of the gate contact metal 380, gate stack 370, and high k material 360 is removed. The removal can include any lithography and etching techniques now known or later developed. However, the removal and etching should preferably be adjacent the gate stack 370 and gate contact metal 380 and spaced from the group of fins 320, such that the material in the portion of the inter-layer area 350 is removed leaving a substantially rectangular area to fill. The removal may include use of a mask particularly suited to a gate cut. The purpose of this area is to separate the gates of device 300, but without introducing stress inducing constrictions of prior methods, as will be better understood from the description of the remaining figures. In some embodiments, the removal may include a dry etch or set of dry etch steps. For instance, is some embodiments, the gate contact metal 380 is first etched away, and then the gate stack 370 and the high k material 360 are etched away simultaneously.

Figure 9:
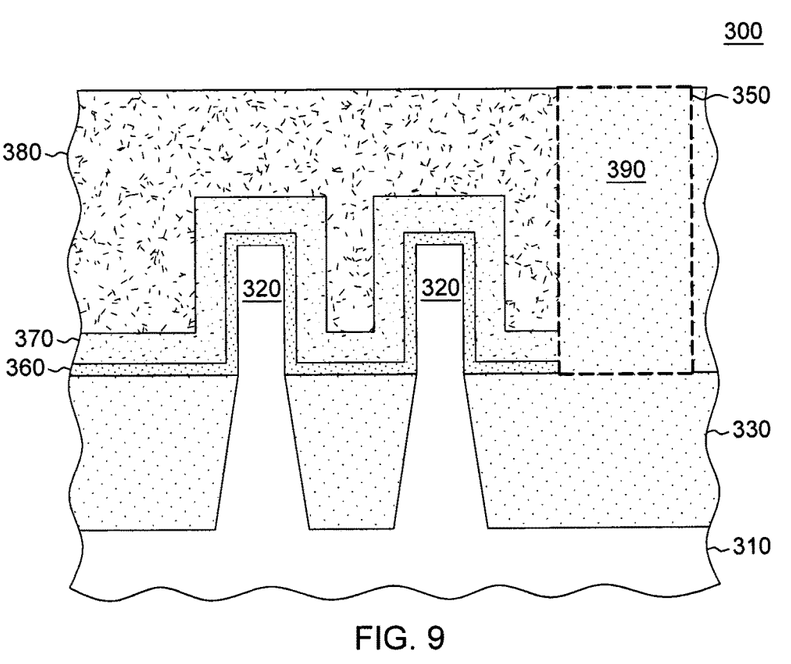
FIG. 9 depicts the structure of FIG. 8 after filling the portion with an inter-layer dielectric, in accordance with one or more aspects of the present invention.

As depicted in FIG. 9, the inter-layer area 350, now a void, may be filled with an inter-layer dielectric (ILD) 390. This can include any dielectric material for separating gates. The ILD 390 may be deposited by an oxide fill using standard deposition techniques due to the clean etch. In some embodiments, following filling with ILD 390, the top of the device 300, which will include a gate contact metal top surface and an ILD portion, may be planarized using chemical mechanical polishing (CMP) or other methods to even out and polish the top surface. As can be seen, ILD 390 now interfaces directly with and contacts a portion of the gate contact metal 380, the gate stack 370, the high k material 360, and the STI layer 330. For instance, a bottom surface of the ILD 390 may be bonded directly to a top surface of the STI layer 330 within the inter-layer area 350. A first portion of a side surface of ILD 390 above the bottom surface interfaces directly with the high k material 360. A second portion of the ILD 390 directly above the first portion can then directly interface with the gate stack 370. A third portion of the side of ILD 390, typically the remaining portion, can directly interface with the gate contact metal 380.

Thus, according to embodiments, as compared to device 100 of the prior art (FIG. 1), ILD 390 (FIG. 9) requires no spacer such that inter-layer area 350 can be completely filled with ILD material, making for a more effective device. Additionally, high k material 360 and gate stack 370 don't extend vertically along inter-layer area 350, removing the stress between ILD 350 and adjacent fin 320 as in prior methods. There is also a reduced possibility of incomplete metal fill with gate contact metal 380 since the area to fill is larger. As devices 300 continue to shrink in size, the benefits increase as previous methods result in amplification of these problems.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A device comprising:
   a plurality of fins;
   an STI layer;
   a high k material on a top surface of the STI layer and surrounding the fins;
   a metal gate stack over the high k material;
   a gate contact metal directly over the metal gate stack and conforming, on a bottom surface, to a shape of the fins; and
   an inter-layer dielectric in a rectangular space adjacent to the high k material, the metal gate stack, and the gate contact metal, the inter-layer dielectric having a side surface in the rectangular space with a first portion that directly contacts the metal gate stack and a second portion that directly contacts the gate contact metal, the first portion of the side surface of the inter-layer dielectric arranged directly above the second portion of the side surface of the inter-layer dielectric.

2. The device of claim 1, wherein the metal gate stack comprises TiN.

3. The device of claim 1, wherein the high k material comprises aluminum oxide, hafnium silicate, zirconium silicate, hafnium oxide, or zirconium oxide.

4. The device of claim 1, wherein a third portion of the side surface of the inter-layer dielectric directly contacts the high k material.

* * * * *